(12) United States Patent
Yoshimura et al.

(10) Patent No.: US 10,389,931 B2
(45) Date of Patent: Aug. 20, 2019

(54) IMAGE PICKUP APPARATUS FOR PROCESSING VIEWPOINT IMAGES GENERATED BASED ON PIXEL SIGNALS OUTPUTTED BY PIXELS EACH HAVING SUBPIXELS, IMAGE PROCESSING METHOD AND IMAGE PROCESSING SYSTEM

(71) Applicant: CANON KABUSHIKI KAISHA, Tokyo (JP)

(72) Inventors: Yuki Yoshimura, Tokyo (JP); Koichi Fukuda, Tokyo (JP); Akihiko Kanda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/658,508

(22) Filed: Jul. 25, 2017

(65) Prior Publication Data

US 2018/0035041 A1 Feb. 1, 2018

(30) Foreign Application Priority Data

Jul. 29, 2016 (JP) ................................ 2016-150271

(51) Int. Cl.
*H04N 5/232* (2006.01)
*H04N 5/369* (2011.01)
(Continued)

(52) U.S. Cl.
CPC ........... *H04N 5/23212* (2013.01); *H04N 1/00* (2013.01); *H04N 5/2256* (2013.01);
(Continued)

(58) Field of Classification Search
CPC ............. H04N 5/3696; H04N 5/23212; H04N 5/23229; H04N 5/23296; G02B 7/28; G02B 7/34
(Continued)

(56) References Cited

U.S. PATENT DOCUMENTS 8,120,606 B2 * 2/2012 Nakamura ............. G03B 35/08
345/419
8,355,058 B2 * 1/2013 Shirai .................. H04N 5/3572
348/222.1
(Continued)

FOREIGN PATENT DOCUMENTS

JP 2011-135191 A 7/2011

*Primary Examiner* — Ngoc Yen T Vu
(74) *Attorney, Agent, or Firm* — Cowan, Liebowitz & Latman, P.C.

(57) ABSTRACT

Provided is an image pickup apparatus including pixels each divided into subpixels that receive respective rays of a pencil having passed through different pupil subregions in an optical system, the apparatus having a viewpoint image generation unit that generates viewpoint images based on pixel signals outputted by the subpixels, an image deviation amount calculation unit that calculates an image deviation amount from the viewpoint images, a conversion factor calculation unit that calculates a conversion factor for use in conversion of the image deviation amount into a defocus amount, and a recording unit that records at least two of the conversion factor, the image deviation amount, and the defocus amount in a storage medium as metadata in association with the viewpoint images or an image obtained from the viewpoint images.

14 Claims, 10 Drawing Sheets

(51) Int. Cl.
*H04N 5/365* (2011.01)
*H04N 1/00* (2006.01)
*H04N 5/225* (2006.01)
*H04N 5/357* (2011.01)
*H01L 27/146* (2006.01)

(52) U.S. Cl.
CPC ..... *H04N 5/23229* (2013.01); *H04N 5/23296* (2013.01); *H04N 5/3572* (2013.01); *H04N 5/3656* (2013.01); *H04N 5/3696* (2013.01); *H01L 27/14643* (2013.01)

(58) Field of Classification Search
USPC .................................. 348/345–350
See application file for complete search history.

(56) References Cited

U.S. PATENT DOCUMENTS

| | | | |
|---|---|---|---|
| 8,593,531 B2 * | 11/2013 | Yamaguchi | H04N 5/2258 348/208.4 |
| 9,531,960 B2 * | 12/2016 | Kimura | H04N 5/2355 |
| 9,686,530 B2 * | 6/2017 | Horikawa | G06T 5/003 |
| 2011/0273471 A1 * | 11/2011 | Nagasaka | H04N 5/23212 345/619 |
| 2012/0147227 A1 * | 6/2012 | Yoshimura | G02B 7/346 348/246 |
| 2016/0057341 A1 * | 2/2016 | Nakayama | H04N 5/23212 348/207.1 |
| 2016/0173869 A1 * | 6/2016 | Wang | G06T 5/50 348/187 |
| 2017/0310878 A1 * | 10/2017 | Mochizuki | H04N 5/23212 |

* cited by examiner

FIG. 11A
FIG. 11B
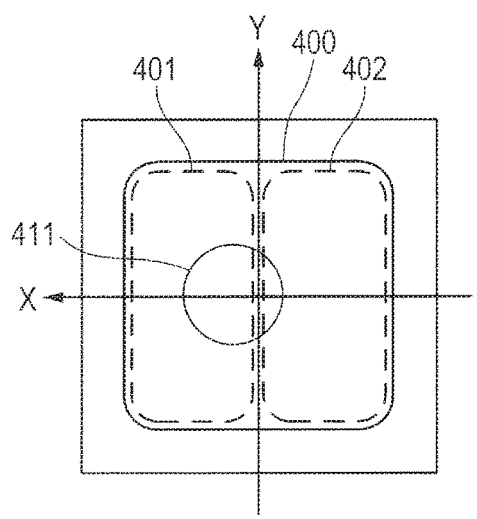
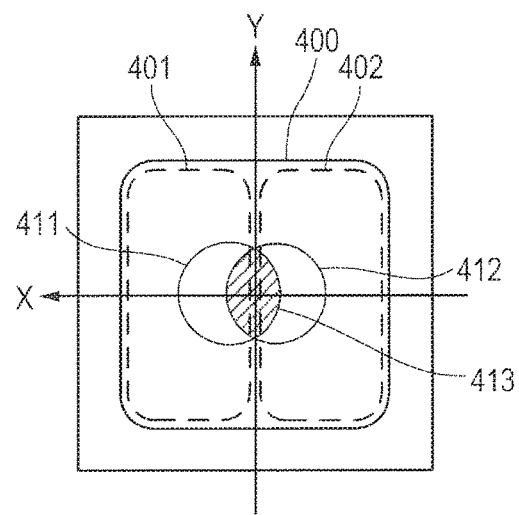
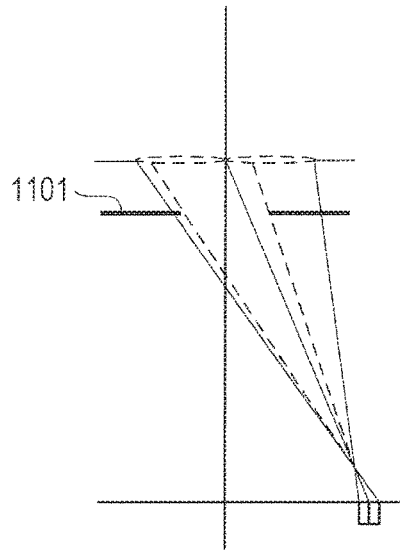
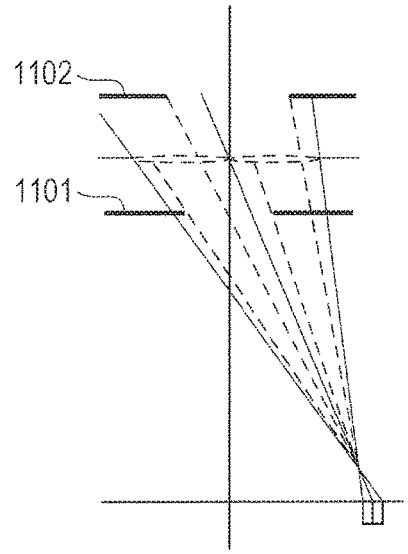

IMAGE PICKUP APPARATUS FOR PROCESSING VIEWPOINT IMAGES GENERATED BASED ON PIXEL SIGNALS OUTPUTTED BY PIXELS EACH HAVING SUBPIXELS, IMAGE PROCESSING METHOD AND IMAGE PROCESSING SYSTEM

BACKGROUND OF THE INVENTION

Field of the Invention

The present invention relates to a technique for processing viewpoint images generated based on pixel signals outputted by pixels each having subpixels.

Description of the Related Art

There has been proposed an image pickup apparatus that includes pixels each divided into subpixels (pupil pixels) and is capable of generating viewpoint images based on pixel signals outputted by the subpixels. Such an image pickup apparatus can achieve functions such as phase detection autofocus (AF) or refocus. Japanese Patent Application Laid-Open No. 2011-135191, for example, describes a technique for recording a defocus amount obtained by an AF sensor, as a file along with the image.

The technique of the Japanese Patent Application Laid-Open No. 2011-135191 records only the defocus amount with the image. This is inconvenient for an application that refers to the file to for example perform particular image processing such as refocus processing that requires an image deviation amount.

SUMMARY OF THE INVENTION

An aspect of the present invention provides an image pickup apparatus including pixels each divided into subpixels that receive respective rays of a pencil having passed through different pupil subregions in an optical system, the apparatus comprising a viewpoint image generation unit that generates viewpoint images based on pixel signals outputted by the subpixels; an image deviation amount calculation unit that calculates an image deviation amount from the viewpoint images; a conversion factor calculation unit that calculates a conversion factor for use in conversion of the image deviation amount into a defocus amount; and a recording unit that records at least two of the conversion factor, the image deviation amount, and the defocus amount in a storage medium as metadata in association with the viewpoint images or an image obtained from the viewpoint images.

Another aspect of the present invention provides a method for processing viewpoint images generated by an image pickup apparatus including pixels each divided into subpixels that receive respective rays of a pencil having passed through different pupil subregions in an optical system, the method comprising the steps of: calculating an image deviation amount from the viewpoint images; and recording at least two of a conversion factor, which is calculated by the image pickup apparatus to be used for conversion of the image deviation amount into a defocus amount, the image deviation amount, and the defocus amount in a storage medium as metadata in association with the viewpoint images or an image obtained from the viewpoint images.

Further features of the present invention will become apparent from the following description of exemplary embodiments with reference to the attached drawings.

BRIEF DESCRIPTION OF THE DRAWINGS

FIGS. 11A and 11B are diagrams illustrating the relation between an effective stop value and peripheral light quantity information in the image pickup apparatus according to the first embodiment.

DESCRIPTION OF THE EMBODIMENTS

Preferred embodiments of the present invention will now be described in detail in accordance with the accompanying drawings.

First Embodiment

An image deviation amount is the amount of deviation of a subject image on the image plane between viewpoint images, and is used for example in refocus processing that adjusts the focus position within an image by changing the relative positions of the viewpoint images. A defocus amount, on the other hand, is a blur in the optical axis direction (an amount of defocus) for each image height, and is used in processing such as defocus processing that corrects the difference in blur between lenses for each image height or distance measuring processing that, in autofocus, measures the actual distance between the camera and an image to be captured.

As described, an image deviation amount and a defocus amount are different from each other in the information that they possess and in the purpose for which they are used. For this reason, aiming to perform image processing appropriately by using the image deviation amount and the defocus amount for their suitable purposes, the present embodiment records, in association with an image, information that allows acquisition of both the image deviation amount and the defocus amount.

[Overall Configuration]

Figure 1:
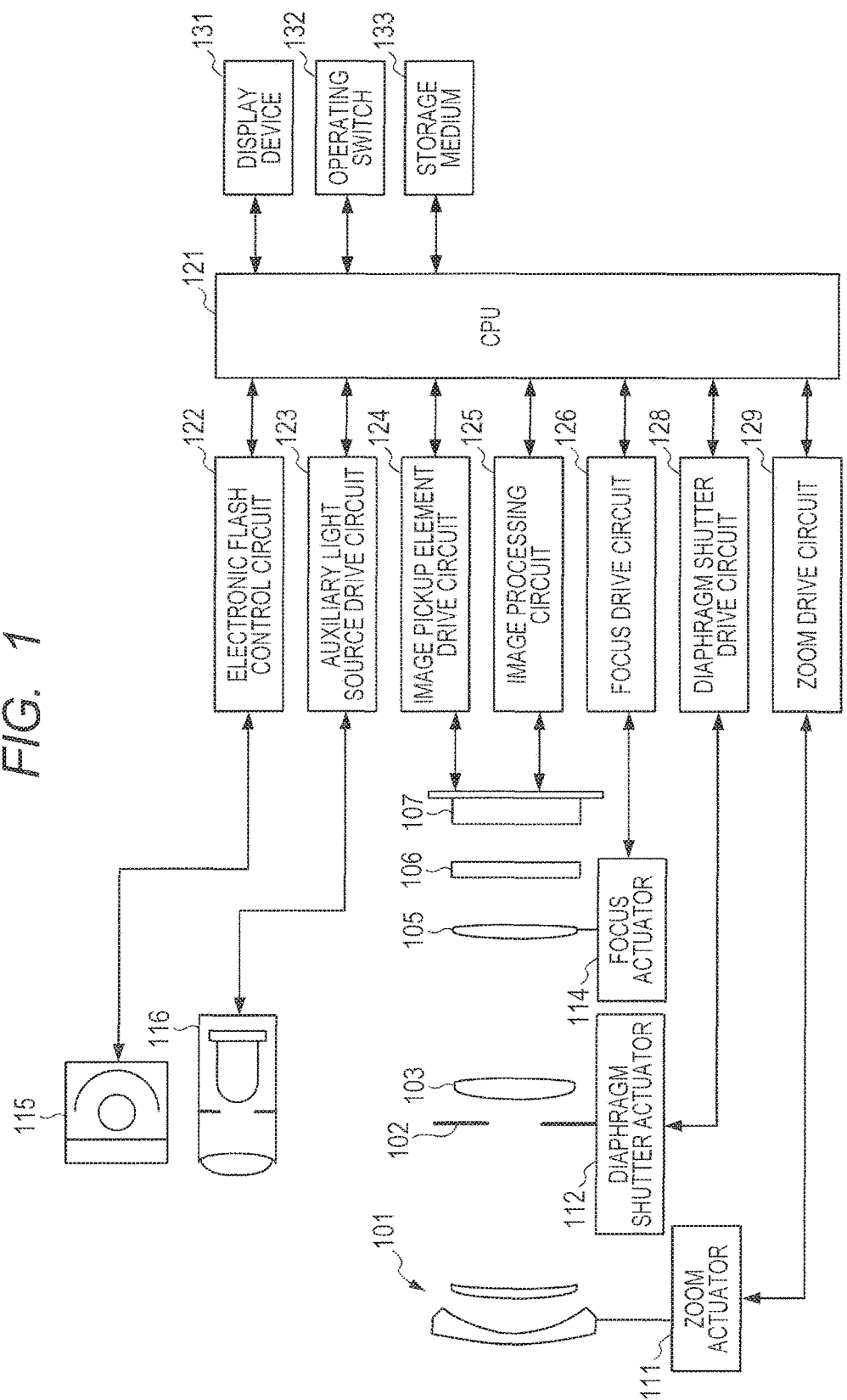
FIG. 1 is a schematic diagram illustrating the configuration of an image pickup apparatus according to a first embodiment.

FIG. 1 is a schematic diagram illustrating the configuration of the image pickup apparatus according to a first embodiment, the image pickup apparatus of the embodiment being applied to a camera as an example. In FIG. 1, a first lens unit 101 is placed at a front end of an imaging optical system and is held while being allowed to move forward and backward in the optical axis direction. A diaphragm shutter 102 adjusts the amount of light for image capturing by adjusting its aperture diameter. For capturing of still images, the diaphragm shutter 102 is also used as a shutter for exposure time adjustment. A second lens unit 103 moves forward and backward in the optical axis direction along with the diaphragm shutter 102, and implements a zooming function in cooperation with the forward/backward movement of the first lens unit 101. A third lens unit 105 performs focus adjustment by moving forward and backward in the optical axis direction. A low-pass filter 106 is an optical element that reduces appearance of false color and a moire pattern in a captured image. An image pickup element 107 is formed by a two-dimensional CMOS photosensor and peripheral circuitry, and is placed on the image plane of the imaging optical system.

A zoom actuator 111 drives the first lens unit 101 or the second lens unit 103 by turning a cam cylinder (not shown) so that the first lens unit 101 or the second lens unit 103 moves forward or backward in the optical axis direction for zooming. A diaphragm shutter actuator 112 controls the aperture diameter of the diaphragm shutter 102 to adjust light quantity for image capturing, and also controls exposure time for still-image capturing. A focus actuator 114 performs focus adjustment by driving and moving the third lens unit 105 forward and backward in the optical axis direction.

A light irradiation unit 115 is an electronic flash for irradiating a subject with light when imaging the subject, and is preferably a flashlight irradiation device with a xenon flashtube, but may be a light irradiation device with an LED that emits light continuously. An AF auxiliary light source 116 projects an image of a mask having a predetermined opening pattern onto a subject through a transmitter lens, so as to improve the focus detection performance for a subject low in brightness or contrast.

A CPU 121 takes various kinds of control of the camera body, and includes components such as an operation unit, a ROM, a RAM, an A/D converter, a D/A converter, and a communication interface circuit. The CPU 121 drives various circuits in the camera based on predetermined programs stored in the ROM, to execute a series of operations such as autofocus, imaging, image processing, and recording. Specifically, the CPU 121 executes processing performed by, for example, a viewpoint image generation unit, an image deviation amount calculation unit, a conversion factor calculation unit, a defocus amount calculation unit, and a recording unit, which will be described later.

An electronic flash control circuit 122 controls the flashing of the light irradiation unit 115 in synchronization with an imaging operation. An auxiliary light source driving circuit 123 controls the flashing of the AF auxiliary light source 116 in synchronization with a focus detection operation. An image pickup element drive circuit 124 controls imaging operation by the image pickup element 107, and also performs A/D conversion on an image acquired from the image pickup element 107 and sends the converted image to the CPU 121. An image processing circuit 125 performs processing on an image acquired from the image pickup element 107, such as γ conversion, color interpolation, and JPEG compression.

A focus drive circuit 126 controls the driving of the focus actuator 114 based on a result of focus detection so that the focus actuator 114 moves the third lens unit 105 forward and backward in the optical axis direction for focus adjustment. A diaphragm shutter drive circuit 128 controls the driving of the diaphragm shutter actuator 112 so that the diaphragm shutter actuator 112 controls the aperture of the diaphragm shutter 102. A zoom drive circuit 129 drives the zoom actuator 111 in accordance with a zooming action performed by a user.

A display unit 131 is a display device such as an LCD, and displays information on camera's capturing mode, a preview image before image capturing, an image for checking after image capturing, an image showing the focusing state upon focus detection, and the like. An operating switch 132 is formed by switches such as a power switch, a release (image-capturing trigger) switch, a zooming switch, and an image capturing mode selector switch. A storage medium 133 is a detachable storage medium such as flash memory, and records captured images and metadata to be described later.

[Image Pickup Element]

Figure 2:
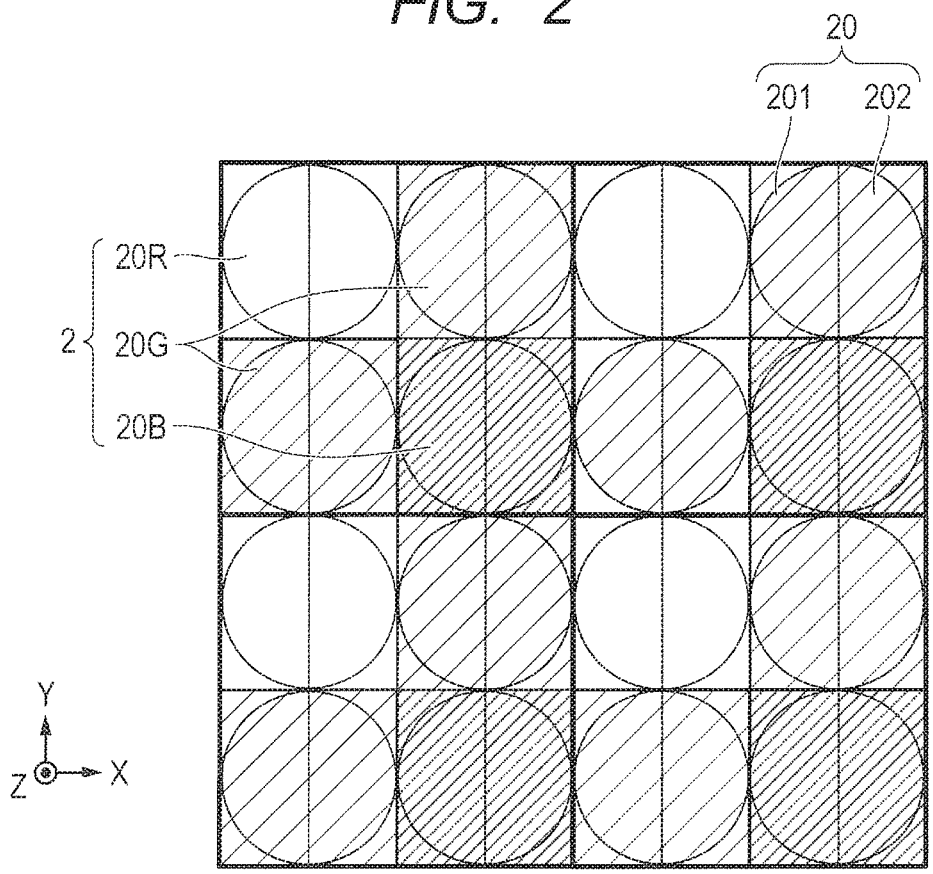
FIG. 2 is a schematic diagram illustrating a pixel arrangement on an image pickup element of the image pickup apparatus according to the first embodiment.

FIG. 2 is a schematic view illustrating a pixel arrangement on the image pickup element 107 of the image pickup apparatus according to the first embodiment. Although FIG. 2 shows only four rows and four columns of pixels 20 to simplify the illustration, the actual image pickup element 107 has more rows and columns of pixels 20. A pixel unit 2 shown in FIG. 2 has two rows and two columns of pixels 20R, 20G, and 20B with different color filters. The pixel unit 2 has the pixel 20R with spectral sensitivity for red (R) at the upper left, the pixel 20G with spectral sensitivity for green (G) at the upper right and the lower left, and the pixel 20B with spectral sensitivity for blue (B) at the lower right. Each pixel 20 is divided into a pair of subpixels 201 and 202. The subpixels 201 and 202 can output pixel signals with parallax information by receiving a pencil of rays that have passed through different pupil subregions of the optical system via a single microlens. The pixels 20 are not limited to being divided into two, or to the arrangement shown in FIG. 2.

The image pickup element 107 of the embodiment can obtain viewpoint images for focus detection using the subpixels 201 and 202 arranged in rows and columns as shown in FIG. 2. The following description assumes that the interval P of the pixels 20 is 4 μm, the number N of pixels 20 is 5,575 rows×3,725 columns≈20,750,000 pixels, the row-direction interval $P_s$ of the subpixels 201 and 202 is 2 μm and the number $N_s$ of the subpixels 201 and 202 is 11,150 rows×3,725 columns≈41,500,000 subpixels. Note however that the present invention is not limited to such a configuration.

Figure 3A:
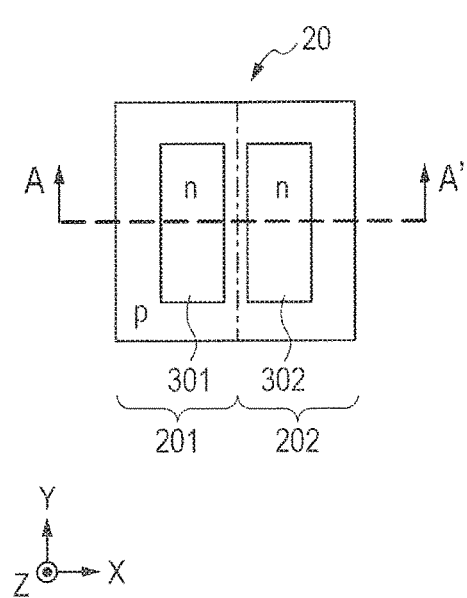
FIGS. 3A and 3B are schematic diagrams illustrating the structure of a pixel in the image pickup apparatus according to the first embodiment.
Figure 3B:
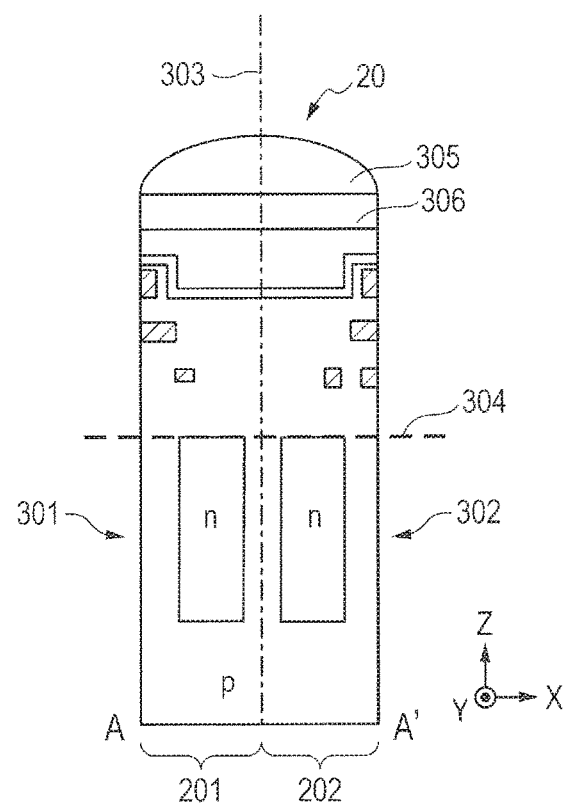

FIGS. 3A and 3B are schematic diagrams illustrating the structure of the pixel 20 in the image pickup apparatus according to the first embodiment. FIG. 3A is a plan view of the pixel 20 in FIG. 2 seen from the light-receiving surface side (+Z side), and FIG. 3B is a sectional view of the pixel 20 taken along line A-A' in FIG. 3A and seen from the −Y side. As shown in FIG. 3B, the pixel 20 has photoelectric converters 301 and 302 in the subpixels 201 and 202, respectively, with division in the X direction being $N_H$ (=2) and division in the Y direction being $N_V$ (=1). The photoelectric converters 301 and 302 may be a PIN structure photodiode having an intrinsic layer between a p-type layer and an n-type layer, or if necessary, may be a p-n junction photodiode without the intrinsic layer.

A microlens 305 to focus incident light is formed on the light-receiving surface side of the pixel 20. A color filter 306 is formed between the microlens 305 and the photoelectric converters 301 and 302. If necessary, the color filter 306 may have different spectral transmittances for the respective subpixels, or may be omitted. Light enters the microlens 305 along an optical axis 303 from the upper side of the pixel 20 (+Z side) in the orientation shown in FIG. 3B and is focused by the microlens 305. Then, the light is filtered by the color filter 306 and then received by a light-receiving surface 304 of the photoelectric converters 301 and 302.

The photoelectric converters 301 and 302 generates pairs of electrons and holes according to the quantity of light received, and the electrons and the holes are separated from each other by a depletion layer, with the negatively-charged electrons being accumulated in the n-type layer. The holes, on the other hand, are discharged to the outside of the pixel 20 through the p-type layer connected to a constant voltage source (not shown). The electrons accumulated in the n-type layer of each of the photoelectric converters 301 and 302 are transferred to a floating diffusion part through a transfer gate, and are converted into a pixel signal by a readout circuit (not shown).

Figure 4:
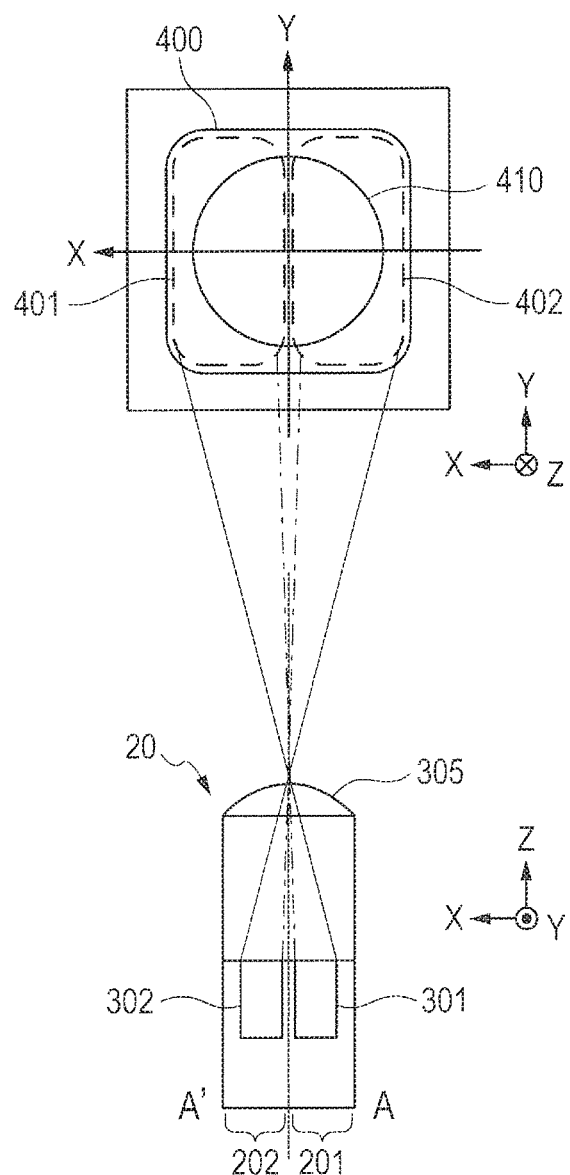
FIG. 4 is a first view illustrating the correspondences between subpixels and pupil subregions in the image pickup apparatus according to the first embodiment.

FIG. 4 is a first view illustrating the correspondences between the subpixels 201 and 202 and pupil subregions 401 and 402 in the image pickup apparatus according to the first embodiment. The lower part of FIG. 4 is, as with the FIG. 3B, a sectional view of the pixel 20 taken along line A-A'. The upper part of FIG. 4 shows the exit pupil surface of the optical system. Note that, in order for the pixel 20 and the exit pupil surface to be axis-aligned, the X axis and the Y axis in the sectional view of the pixel 20 in FIG. 4 are inverted from those in the sectional view of the pixel 20 in FIG. 3B.

A pupil region 400 is a pupil region the light passing through which can be received by the pixels 20. The pupil subregions 401 and 402 are pupil regions the light passing through which can be received by the subpixels 201 and 202, respectively. The pupil subregion 401 has its barycenter displaced to the +X side and is in conjugate relation, with respect to the microlens 305, with the light-receiving surface of the photoelectric converter 301 whose barycenter is displaced to the −X side. Similarly, the pupil subregion 402 has its barycenter displaced to the −X side and is in a conjugate relation, with respect to the microlens 305, with the light-receiving surface of the photoelectric converter 302 whose barycenter is displaced to the +X side.

A pupil region 410 is a pupil region defined in consideration of vignetting by the frames (such as a lens frame and an aperture stop frame). The size, position, and shape of the pupil region 410 vary depending on the combination of the stop value of the diaphragm shutter 102, the exit pupil distance, which is determined by such factors as the distance from the exit pupil to the light-receiving surface 304, and the image height on the image pickup element 107.

Light entering the pixel 20 is focused by the microlens 305 into a focus position. The diameter of the focused spot of light cannot be smaller than a diffraction limit Δ and has a finite size, because light is diffracted due to its wave nature. The light-receiving surface of the photoelectric converters 301 and 302 is approximately 1 μm to 2 μm, whereas the focused spot of the microlens 305 is also approximately 1 μm. For this reason, the pupil subregion 401 and the pupil subregion 402 have distribution of light receiving rate (pupil intensity) without a clear pupil division due to diffraction blur.

Figure 5:
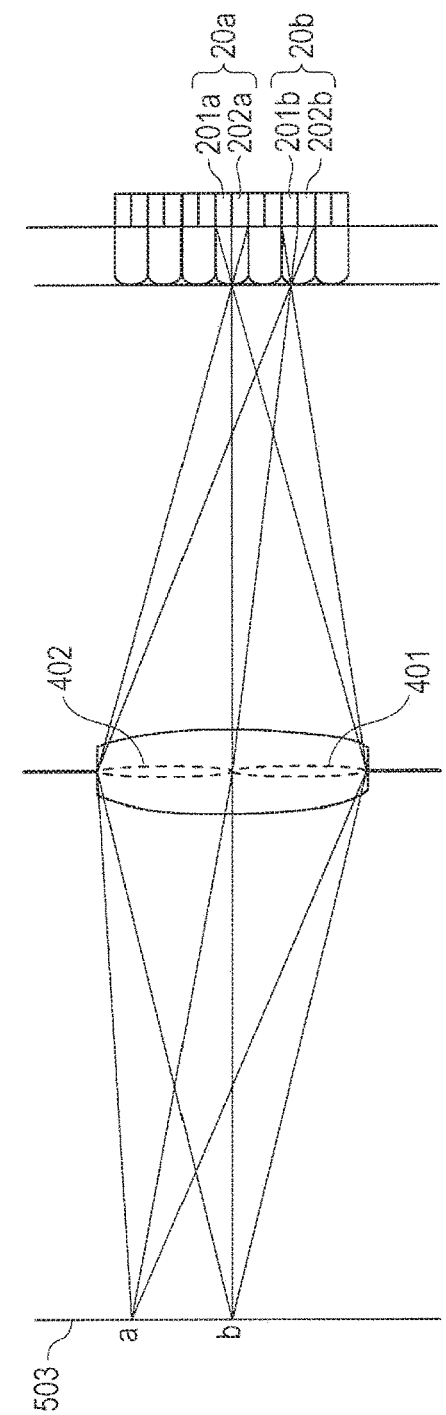
FIG. 5 is a second view illustrating the correspondences between subpixels and pupil subregions in the image pickup apparatus according to the first embodiment.

FIG. 5 is a second view illustrating the correspondences between the subpixels 201, 202 and the pupil subregions 401, 402 in the image pickup apparatus according to the first embodiment. The right part of FIG. 5 has pixels 20a, 20b, . . . arranged, and the pixel 20a and the pixel 20b are divided into subpixels 201a and 202a and subpixels 201b and 202b, respectively. Rays of a pencil from point 'a' on a subject 503 that have passed through the pupil subregions 401 and 402 are received by the subpixels 201a and 202a of the pixel 20a, respectively. Similarly, rays of a pencil from point 'b' on the subject 503 that have passed through the pupil subregions 401 and 402 are received by the subpixels 201b and 202b of the pixel 20b, respectively. For all the pixels 20, the image pickup apparatus adds together an image signal based on the quantity of light received by the subpixel 201 and an image signal based on the quantity of light received by the subpixel 202, generating an image of N pixels (referred to as an "addition image" hereinbelow).

To generate viewpoint images with parallax information in addition to the addition image obtained as described above, the image pickup apparatus generates a first viewpoint image based on the pixel signals outputted by the subpixels 201 of the pixels 20, and then obtains a second viewpoint image by subtracting the first viewpoint image from the addition image. Alternatively, if necessary, the image pickup apparatus may obtain a pair of viewpoint images by generating a first viewpoint image based on the pixel signals outputted by the subpixels 201 of the pixels 20 and generating a second viewpoint image based on the pixel signals outputted by the subpixels 202 of the pixels 20. The addition image, the first viewpoint image, and the second viewpoint image are generated as, for example, Bayer arrangement data.

Being data with different viewpoints, the addition image, the first viewpoint image, and the second viewpoint image can be improved in their degree of image coincidence by being subjected to shading correction to be described below. If necessary, processing such as demosaicing may be performed, as well. Although each pixel 20 in FIG. 5 is divided into the subpixels 201 and 202 horizontally, the pixel 20 may be divided vertically, or both horizontally and vertically.

[Relation Between the Defocus Amount and the Image Deviation Amount]

Figure 6:
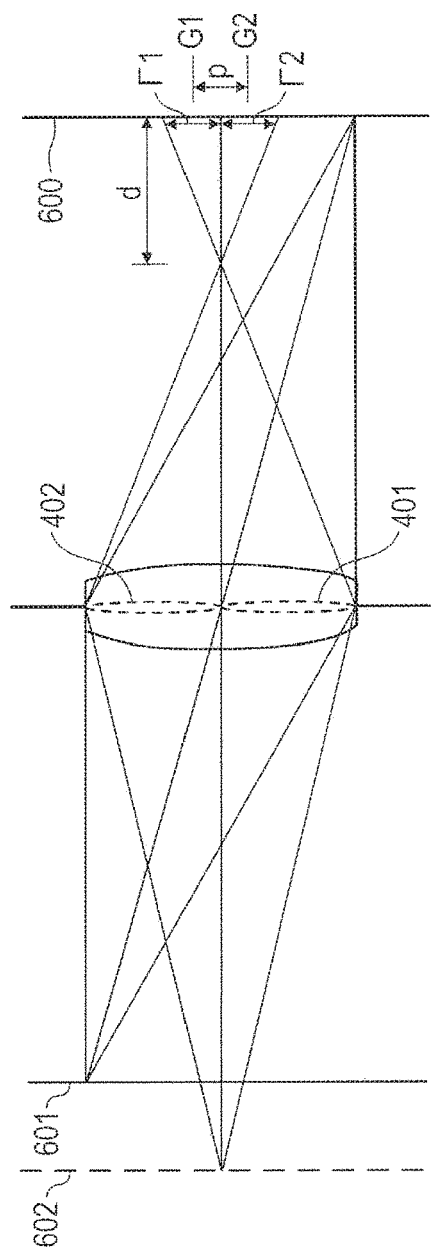
FIG. 6 is a diagram illustrating the relation between a defocus amount and an image deviation amount in the image pickup apparatus according to the first embodiment.

FIG. 6 is a diagram illustrating the relation between a defocus amount d and an image deviation amount p in the image pickup apparatus according to the first embodiment. With reference to FIG. 6, a description is now given of a defocus amount and an image deviation amount calculated from viewpoint images. As in FIG. 5, rays of pencils that have passed through the pupil subregions 401 and 402 enter the pixels 20 of the image pickup element 107 placed on an image plane 600 shown in FIG. 6, and are received by the subpixels 201 and 202 of the pixels 20.

The magnitude |d| of the defocus amount d shown in FIG. 6 is defined as the distance from the position where an image of a subject is formed (referred to as an image-formed position hereinbelow) to the image plane 600. The sign of the defocus amount d is negative (d<0) when the image-formed position is closer to a subject 601 or 602 than the image plane 600 is (i.e., a front focus state), and is positive (d>0) when the image plane 600 is closer to the subject 601 or 602 than the image-formed position is (i.e., a rear focus state). When the image-formed position is on the image plane 600 (i.e., in focus), d=0. In FIG. 6, an image of the subject 601 is in focus (d=0), and an image of the subject 602 is in a front focus state (d<0). Hereinbelow, the front focus state and the rear focus state are called a defocus state (|d|>0).

Rays of a pencil from the subject 602, which is in a front focus state (d<0), pass through the pupil subregion 401, are focused before the image plane 600, and then spreads on the image plane 600 by a width Γ1 with a barycenter position G1 of the rays being the center of the spread, forming a blurry image. This blurry image is received by the subpixels 201 of the pixels 20 arranged on the image plane 600, and recorded as a subject image which is spread by the width Γ1 with the barycenter position G1 on the image plane 600 being the center of the spread. Similarly, other rays of the pencil pass through the pupil subregion 402, are received by the subpixels 202 of the pixels 20 arranged on the image plane 600, and are recorded as a blurry subject image which is spread by a width Γ2 with the barycenter position G2 on the image plane 600 being the center of the spread.

The widths Γ1 and Γ2 of the subject image increase almost in proportion to the magnitude |d| of the defocus amount d. Hence, the magnitude |p| of the image deviation amount p of the subject image between first focus detection signals outputted by the subpixels 201 and second focus detection signals outputted by the subpixel 202 (p=G1−G2) also increases almost in proportion to the magnitude |d| of the defocus amount d. The same is true of the rear focus state (d>0), except that the direction of the image deviation of the subject image between the first and second focus detection signals is opposite from that in the front focus state.

As described, the magnitude |d| of the defocus amount calculated based on the first and second focus detection signals increases almost in proportion to the magnitude |p| of the image deviation amount calculated based on the first and second focus detection signals.

[Focus Detection]

A description is now given of focus detection processing using phase detection in the embodiment. In focus detection using phase detection, while the first focus detection signal outputted by the subpixel 201 and the second focus detection signal outputted by the subpixel 202 are shifted relatively, a correlation amount representing the degree of coincidence between the signals is calculated, and an image deviation amount is detected from a shift amount with the highest correlation (the degree of coincidence between the signals). Taking advantage of the fact that the magnitude |d| of the defocus amount of imaging signals increases almost in proportion to the magnitude |p| of the image deviation amount, the defocus amount d is calculated from the image deviation amount p.

Figure 7:
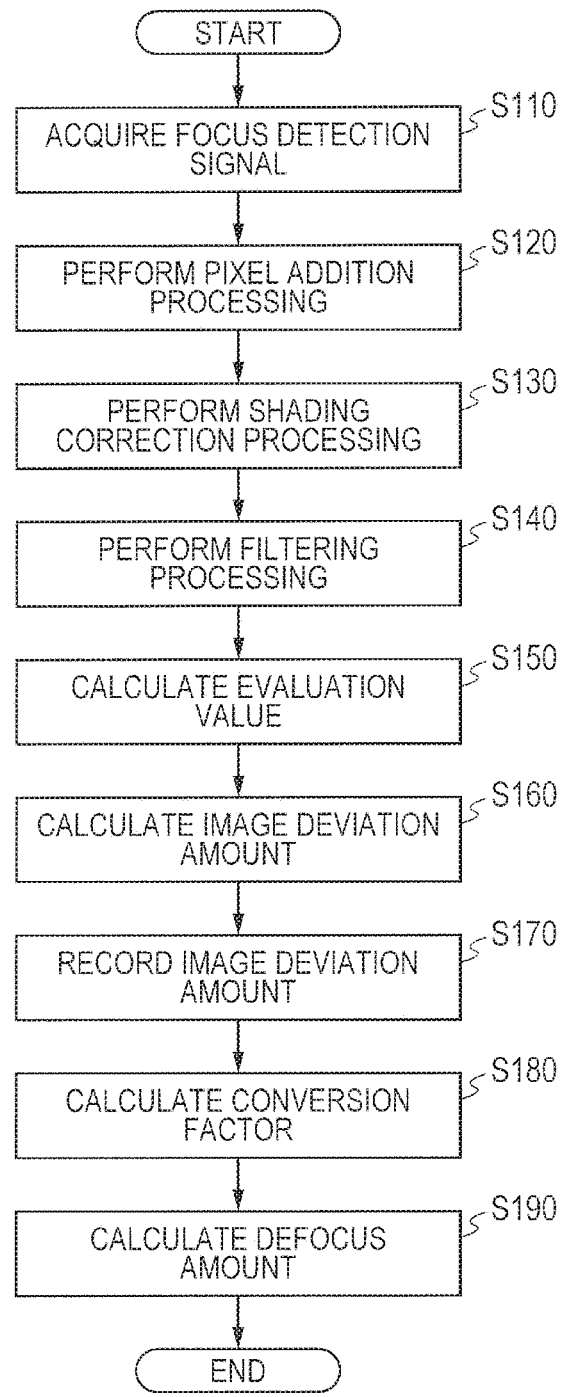
FIG. 7 is a flowchart of focus detection processing performed by the image pickup apparatus according to the first embodiment.

FIG. 7 is a flowchart illustrating the focus detection processing performed by the image pickup apparatus according to the first embodiment. The viewpoint image generation unit, the image deviation amount calculation unit, the conversion factor calculation unit, the defocus amount calculation unit, and the recording unit that perform the focus detection processing shown in FIG. 7 are implemented mainly by the image processing circuit 125 or the CPU 121 shown in FIG. 1.

In Step S110, the viewpoint image generation unit first sets, in an effective pixel area of the image pickup element 107, a focus detection area for which focus adjustment is to be performed. The viewpoint image generation unit next reads out first focus detection signals from the subpixels 201 in the focus detection area. Similarly, the viewpoint image generation unit reads out second focus detection signals from the subpixels 202 in the focus detection area.

In Step S120, for each predetermined number of pixels 20 arranged in the row direction, the viewpoint image generation unit performs addition processing on the first focus detection signals and on the second focus detection signals to reduce the data amount of the focus detection signals. The viewpoint image generation unit further performs Bayer (RGB) addition processing to turn the RGB signals into luminance (Y) signals. These two steps of addition processing are collectively called pixel addition processing in FIG. 7.

In Step S130, the image deviation amount calculation unit performs shading correction processing (optical correction processing) on the first focus detection signals and the second focus detection signals to improve the degree of image coincidence. In Step S140, the image deviation amount calculation unit performs filtering processing on the first focus detection signals and the second focus detection signals to extract signal components in a certain bandwidth and thereby improves the focus detection performance.

In Step S150, the image deviation amount calculation unit performs shift processing that shifts the filtered first focus detection signals and second focus detection signals relatively in the pupil division direction, and thus calculates a correlation amount indicative of the degree of coincidence between the signals. The correlation amount is used as an evaluation value. A correlation amount COR is given by, for example, the following Formula (1):

$$COR(s_1) = \sum_{k1 \in W} |A(k_1) - B(k_1 - s_1)|, \qquad (1)$$

$$s_1 \in \Gamma 1$$

where A(k1) is the k1-th filtered first focus detection signal, B(k1) is the k1-th filtered second focus detection signal, W is the range of number k1 corresponding to the focus detection area, s1 is a shift amount in first shift processing, and Γ1 is the shift range for the shift amount s1.

The image deviation amount calculation unit generates a shift subtraction signal by associating the k1-th first focus detection signal A (A(k1)) with the (k1−s1)-th second focus detection signal B (B(k1−s1)) and performing subtraction on them. The image deviation amount calculation unit then calculates the absolute value of the generated shift subtraction signal, obtains the sum of the absolute values for number k1 in the range W corresponding to the focus detection area, and calculates the correlation amount COR (s1). If necessary, the correlation amounts COR calculated for a certain number of rows may be added together for each shift amount.

In Step S160, the image deviation amount calculation unit performs subpixel operation on the calculated correlation amount COR to calculate a real-valued shift amount where the correlation amount is the smallest, and calculates an image deviation amount from the shift amount. If focus detection signals for a plurality of image heights are acquired in Step S110, the image deviation amount is calculated for the plurality of image heights.

Figure 8:
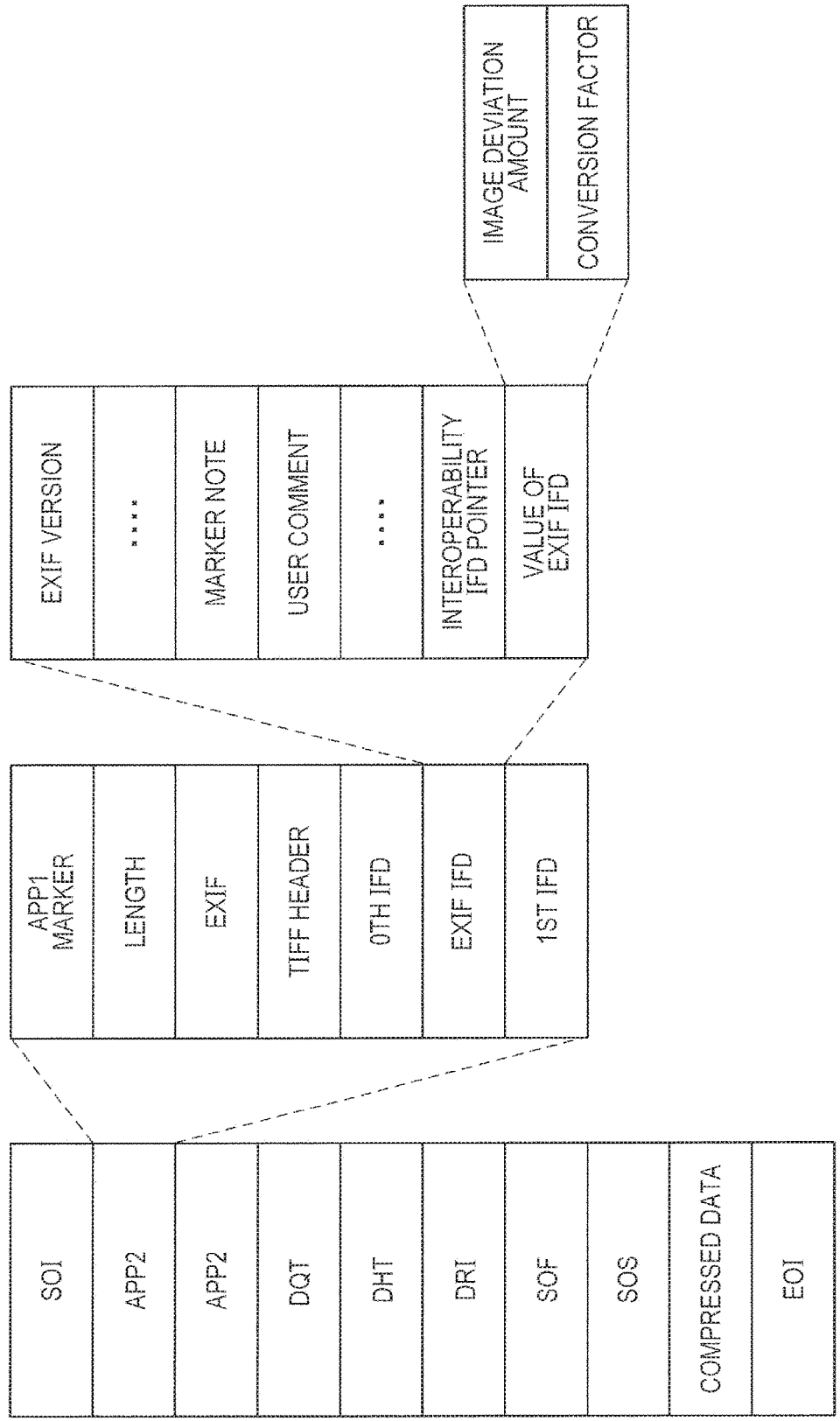
FIG. 8 is a diagram showing an example of JPEG format according to the first embodiment.
Figure 9:
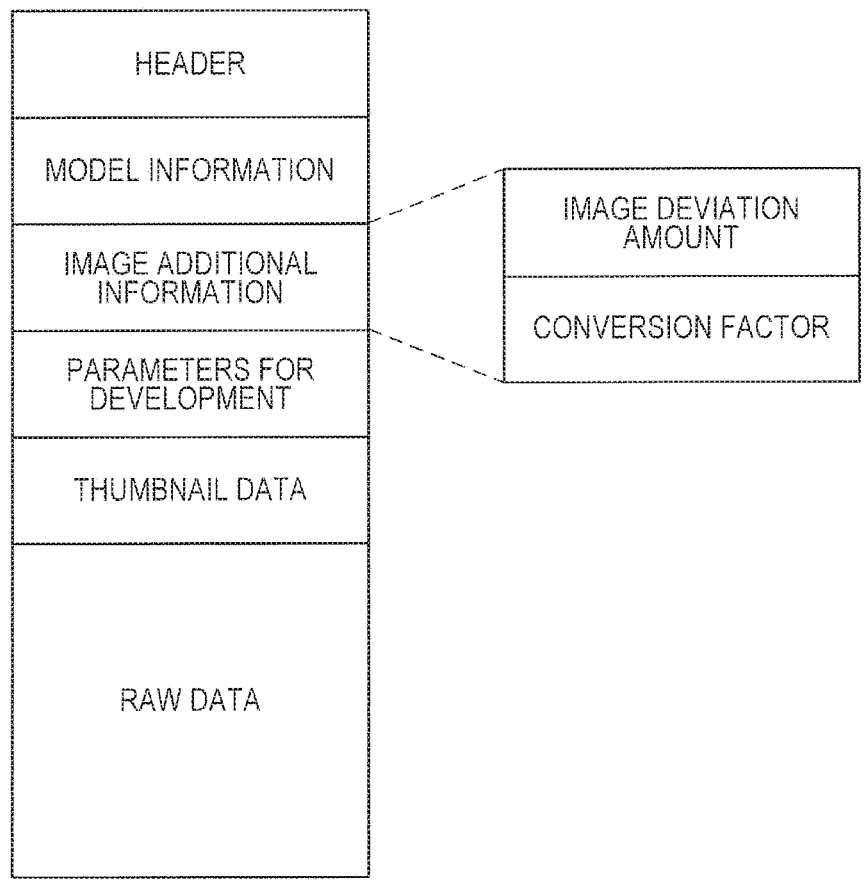
FIG. 9 is a diagram showing an example of RAW format according to the first embodiment.
Figure 10:
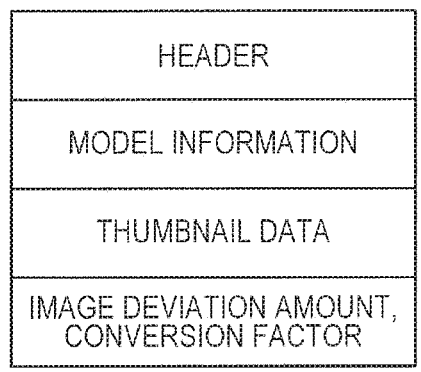
FIG. 10 is a diagram showing the format of a container file according to the first embodiment.

In Step S170, the recording unit records the image deviation amount calculated in Step S160 as metadata in the storage medium 133 in association with the viewpoint images generated from the first focus detection signals and the second focus detection signals or with an image obtained from the viewpoint images. The format of the metadata is not limited, as long as the metadata is recorded in association with the image in some way. For example, the metadata may be recorded as Exif information in an image recorded in JPEG format as shown in FIG. 8, or as image addition information in RAW data format as shown in FIG. 9. As shown in FIG. 10, the image deviation amount may also be recorded along with the image as a container file that can store a plurality of related pieces of data collectively. The image deviation amount may also be recorded as a separate file associated with the image.

Alternatively, a two-dimensional image deviation amount map may be generated from image deviation amounts and recorded in the storage medium 133. An image deviation amount map has image deviation amounts in the focus detection area obtained by the processing from Step S110 to S160 and calculated two dimensionally for a plurality of image heights.

Since the calculated image deviation amount is thus recorded as metadata to be re-usable whenever necessary, processing for re-calculating the image deviation amount can be omitted. The image deviation amount can also be used later by an external processing apparatus outside the image pickup apparatus. For example, the image pickup apparatus may have an image deviation amount calculated and recorded therein as metadata and may cause an external processing apparatus to perform image processing by using the image deviation amount recorded as metadata. Such an image processing system can reduce the load of image processing on the image pickup device.

In Step S180, based on information such as a stop value, an exit pupil distance, and an image height on the image pickup element 107, the conversion factor calculation unit calculates a conversion factor used to obtain a defocus amount from the image deviation amount. This conversion factor may be one that converts the image deviation amount into the defocus amount and vice versa. Next, the recording unit records the conversion factor, calculated by the conversion factor calculation unit, as metadata in the storage medium 133 in association with the image. The processing in Step S180 will be described in more detail later using FIG. 12. Instead of the recording unit of the image pickup apparatus recording the conversion factor as metadata, a recording unit of an external processing apparatus may receive the conversion factor from the image pickup apparatus and record the conversion factor as metadata. This configuration relieves load on the image pickup apparatus for the recording processing.

In Step S190, the defocus amount calculation unit calculates a defocus amount by multiplying the image deviation amount calculated in Step S160 by the conversion factor calculated in Step S180. Then, the recording unit records the defocus amount, calculated by the defocus amount calculation unit, as metadata in the storage medium 133 in association with the image. Instead of the defocus amount calculation unit of the image pickup apparatus calculating the defocus amount, a defocus amount calculation unit of an external processing apparatus may calculate the defocus amount. In addition, instead of the recording unit of the image pickup apparatus recording the defocus amount as metadata, a recording unit of the external processing apparatus may record the defocus amount as metadata. This configuration relieves load on the image pickup apparatus.

A two-dimensional defocus amount map may be generated from defocus amounts and recorded in the storage medium 133. A defocus amount map has two-dimensionally calculated defocus amounts for a plurality of image heights. A conversion factor map used to obtain the defocus amount map from the image deviation map may be calculated similarly. The conversion factor map may be one that converts the image deviation amount map into the defocus amount map and vice versa.

Regarding Step S180, the stop value for imaging referred to in the processing of Step S180 for the calculation of the conversion factor may be such that an effective stop value changes according to the image height due to vignetting.

FIGS. 11A and 11B are diagrams illustrating the relation between an effective stop value and peripheral light quantity information in the image pickup apparatus according to the first embodiment. If there is only one frame 1101 that causes vignetting, such as a lens frame or a stop frame, the area of a pupil area 411 does not change depending on the image height, so that the effective stop value does not change much. However, as shown in FIG. 11B, an actual imaging optical system has a plurality of frames 1101 and 1102 for components such as lenses. Then, the area of a pupil area 413, which is an overlapping part between the pupil area 411 and a pupil area 412 respectively corresponding to vignetting by the frames 1101 and 1102, may change depending on the image height. As a result of the vignetting by the frames 1101 and 1102, the effective stop value may change depending on the image height.

In many cases, when vignetting is caused by lenses or the like, light quantity decreases toward the edge of the image plane of the image pickup element 107 (decrease in peripheral light quantity). Each lens has its own unique distribution of the decrease in peripheral light quantity. Thus, the image pickup apparatus may record therein information on the peripheral light quantity of the imaging optical system (peripheral light quantity information) and be configured to correct the decrease in peripheral light quantity after imaging. By referring to the peripheral light quantity information, the image pickup apparatus can estimate the amount of vignetting caused by the lens frame, and can thereby acquire an effective stop value according to the image height on the image pickup element 107.

An effective stop value F' is given by the following Formula (2) using an image-capturing stop value F:

$$F' = \frac{F}{f(V(x, y))} \quad (2)$$

where V(x,y) is the peripheral light quantity information at an image height (x,y) on the image pickup element 107, and f(V(x,y)) is a function of V(x,y). Since an optimal function form of f(V(x,y)) is different for each lens depending on the shape of vignetting caused by the lens, a function suitable for the lens needs to be used. The following Formula (3) gives f(V(x,y)) for a case where the shape of vignetting is almost circular, and the following Formula (4) gives f(V(x,y)) for a case where the shape of vignetting is almost oval.

$$f(V(x,y)) = \sqrt{V(x,y)} \quad (3)$$

$$f(V(x,y)) = V(x,y) \quad (4)$$

There are various models and formulae for representing the shape of vignetting, and the function form of the peripheral light quantity information V(x,y) is not limited to those based on Formulae (3) and (4) given above. As the stop value increases (the diameter of the aperture decreases), vignetting is caused less by a lens frame, and only by an aperture stop frame. Thus, when the aperture is decreased to more than a certain extent, correction for peripheral light falloff is unnecessary.

Figure 12:
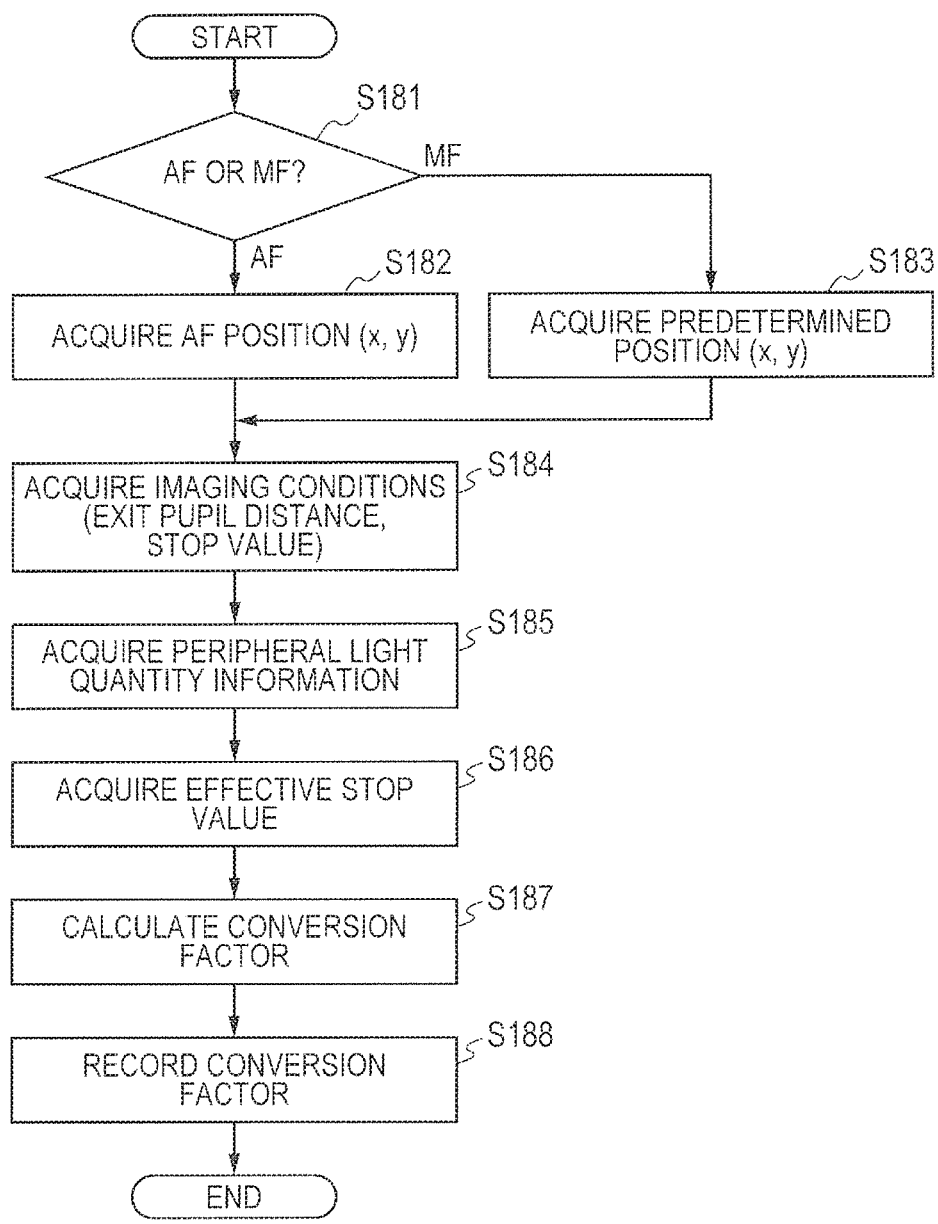
FIG. 12 is a flowchart of conversion factor calculation processing performed by the image pickup apparatus according to the first embodiment.

FIG. 12 is a flowchart illustrating the conversion factor calculation processing performed by the image pickup apparatus according to the first embodiment. The flowchart in FIG. 12 illustrates the details of the processing of Step S180 in FIG. 7. The conversion factor calculation unit and the recording unit that perform the conversion factor calculation processing shown in FIG. 12 may be implemented mainly by the CPU 121 of the image pickup apparatus.

In Step S181, the conversion factor calculation unit checks the setting of the focus detection method used in image capturing. Focusing methods include autofocus (AF) or manual focus (MF).

When the setting of the focus detection method is AF, the conversion factor calculation unit proceeds to Step S182 to acquire, from for example the storage medium 133 of the image pickup apparatus, positional information containing the height (x,y) of an image focused by AF processing. When the setting of the focusing method is MF, the conversion factor calculation unit proceeds to Step S183 to acquire, from for example the storage medium 133 of the image pickup apparatus, positional information containing an image height (x,y) corresponding to a predetermined reference position. A constant image height (x,y) may be used in the following processing irrespective of the focus detection method used, in which case Steps S181 to S183 may be omitted.

In Step S184, the conversion factor calculation unit acquires at least an exit pupil distance and a stop value as image-capturing conditions, from for example the storage medium 133 of the image pickup apparatus or a memory in the lens unit. In Step S185, the conversion factor calculation unit acquires the peripheral light quantity information described above using FIGS. 11A and 11B from for example the storage medium 133 of the image pickup apparatus or the memory in the lens unit. When the setting of the focus detection method is AF, the conversion factor calculation unit may acquire peripheral light quantity information on only the image height of an image focused, or peripheral light quantity information on all the image heights. When the setting of the focus detection method is MF, the conversion factor calculation unit may acquire peripheral light quantity information on only a reference image height or peripheral light quantity information on all the image heights.

Using the peripheral light quantity information acquired in Step S185, in Step S186 the conversion factor calculation unit calculates an effective stop value for one or more image heights used to acquire a conversion factor. Note that the image-capturing stop value F may be used as an image capturing condition instead of the effective stop value F', in which case Steps S185 and S186 may be omitted. In Step S187, the conversion factor calculation unit calculates a conversion factor using the exit pupil distance, the stop value or the effective stop value, and the image height.

In Step S188, the recording unit of the image pickup apparatus records the calculated conversion factor as metadata along with the image deviation amount, in association with the viewpoint images or an image obtained from the viewpoint images. Alternatively, the image pickup apparatus may send the conversion factor to an external processing apparatus along with the image and the image deviation amount, and a recording unit of the external processing apparatus may receive the conversion factor and record it as metadata along with the image deviation amount in association with the image. As is the case with the image deviation amount, any format may be used for recording the conversion factor. Since the conversion factor is thus recorded as metadata along with the image deviation amount in association with the image, the image pickup apparatus can calculate the defocus amount anytime using the image deviation amount and the conversion factor.

If the storage medium 133 of the image pickup apparatus has sufficient space, the calculated defocus amount may be recorded as metadata along with the conversion coefficient in association with the viewpoint images or an image obtained from the viewpoint images. As is the case with the image deviation amount and the conversion coefficient, any format may be used for recording the defocus amount. When the defocus amount is thus recorded as metadata in association with the image, the image pickup apparatus can omit the processing for re-calculating the defocus amount. Although the defocus amount is calculated by multiplication of the image deviation amount by the conversion factor, it is also possible to calculate the image deviation amount by division of the defocus amount by the conversion factor. Either method may be used.

[Relation Between the Image Deviation Amount and the Defocus Amount]

Since an image deviation amount and a defocus amount are different from each other in physical properties, they are used for different purposes in image processing. An image deviation map represents the amount of parallax between a pair of images having a difference in viewpoint in a direction parallel to the image pickup element 107. Thus, in image processing, the deviation amount is used for such processing as refocus processing in which images with different viewpoints are changed in their relative positions to change the focus position in the image. The defocus amount, on the other hand, represents the amount of deviation of focus in a direction perpendicular to the image pickup element 107 for each image height. Thus, the defocus amount is used in such processing as blur processing for changing the blur level for each image height and distance measurement processing since the defocus amount and the focus detection distance can be used to calculate the actual distance from the camera to the object to be captured.

When two-dimensionally arranged data are defined as a map, the finer the image deviation map (or the defocus amount map) is divided, the finer the acquired subject information can be. The conversion factor, on the other hand, is uniquely determined by image-capturing conditions, irrespective of subject conditions. A conversion factor can be reduced in data amount and accurately calculated by being decimated for storage and interpolated for use since the change in image height is successive, or by storing an image deviation amount using an approximate function of the image height. Thus, to reduce the data amount, it is more preferable to store the conversion factor and one of the image deviation amount map and the defocus amount map with high accuracy, than to store both of the image deviation amount map and the defocus amount map with high accuracy. However, the present invention is not limited to the above, and at least two of the conversion factor, the image deviation amount, and the defocus amount may be recorded as metadata in association with the image.

As described above, the image pickup apparatus of the embodiment includes the image deviation amount calculation unit that calculates an image deviation amount from viewpoint images and the conversion factor calculation unit that calculates a conversion factor used to convert the image deviation amount into a defocus amount. The image pickup apparatus of the embodiment further includes a recording unit that records, in the storage medium, at least two of the conversion factor, the image deviation amount, and the defocus amount as metadata in association with the viewpoint images or an image obtained from the viewpoint images. Such a configuration achieves an image pickup apparatus and an image processing method that can perform image processing using the image deviation amount and the defocus amount for their suitable purposes.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-150271, filed Jul. 29, 2016 which is hereby incorporated by reference herein in its entirety.

What is claimed is:

1. An image pickup apparatus including pixels each divided into subpixels mutually having parallaxes, the apparatus comprising
at least one processor; and
a memory storing instructions which cause the at least one processor to perform operations of following units:
a viewpoint image generation unit that generates viewpoint images based on pixel signals outputted by the subpixels;
an image deviation amount calculation unit that calculates an image deviation amount from the viewpoint images;
a conversion factor calculation unit that calculates a conversion factor for use in conversion of the image deviation amount into a defocus amount; and
an outputting unit that outputs the conversion factor and the image deviation amount in association with the viewpoint images or an image obtained from the viewpoint images;

wherein the conversion factor and the image deviation amount are stored in a storage medium in association with the viewpoint images or an image obtained from the viewpoint images.

2. The image pickup apparatus according to claim 1, wherein the
the storage medium that stores the image deviation amount and the conversion factor as metadata of the viewpoint images or an image obtained from the viewpoint images.

3. The image pickup apparatus according to claim 1, wherein the at least one processor further perform operations of
a defocus amount calculation unit that calculates the defocus amount from the image deviation amount using the conversion factor.

4. The image pickup apparatus according to claim 1, wherein
the conversion factor converts the image deviation amount into the defocus amount and vice versa.

5. The image pickup apparatus according to claim 1, wherein
the recording unit records the metadata in a file separate from a file of the image.

6. The image pickup apparatus according to claim 1, wherein
the recording unit records the metadata and the image in a container file.

7. The image pickup apparatus according to claim 1, wherein
the recording unit records the image in JPEG format, and records the metadata as Exif information of the JPEG format.

8. The image pickup apparatus according to claim 1, wherein
the conversion factor calculation unit calculates the conversion factor based on information including a stop value, an exit pupil distance, and an image height.

9. The image pickup apparatus according to claim 8, wherein
the conversion factor calculation unit calculates the stop value based on information including peripheral light quantity information.

10. A method for processing viewpoint images generated by an image pickup apparatus including pixels each divided into subpixels mutually having parallaxes, the method comprising the steps of:
calculating an image deviation amount from the viewpoint images; and
outputting a conversion factor, which is calculated by the image pickup apparatus to be used in conversion of the image deviation amount into a defocus amount, and the image deviation amount in association with the viewpoint images or an image obtained from the viewpoint images;
wherein the conversion factor and the image deviation amount are stored in a storage medium in association with the viewpoint images or an image obtained from the viewpoint images.

11. An image processing system comprising:
an image pickup apparatus including pixels each divided into subpixels that receive respective rays of a pencil having passed through different pupil subregions in an optical system, and generates viewpoint images based on pixel signals outputted by the subpixels; and an external processing apparatus that processes the viewpoint images, wherein the image pickup apparatus includes
at least one processor; and
a memory storing instructions which cause the at least one processor to perform operations of following units:
an image deviation amount calculation unit that calculates an image deviation amount from the viewpoint images and a conversion factor calculation unit that calculates a conversion factor for use in conversion of the image deviation amount into a defocus amount, and
an outputting unit, included in the external processing apparatus, that outputs the conversion factor and the image deviation amount in association with the viewpoint images or an image obtained from the viewpoint images;
wherein the conversion factor and the image deviation amount are stored in a storage medium in association with the viewpoint images or an image obtained from the viewpoint images.

12. The image pickup apparatus according to claim 1, wherein the at least one processor further perform operations of:
a generation unit generating a two-dimensional image deviation amount map based on image deviation amounts calculated by the image deviation calculation unit;
wherein the conversion factor and the generated image deviation amount map are stored in the storage medium in association with the viewpoint images or an image obtained from the viewpoint images.

13. The image pickup apparatus according to claim 1, wherein the at least one processor further perform operations of:
a generation unit generating a two-dimensional defocus amount map based on defocus amounts obtained by converting image deviation amounts calculated by the image deviation calculation unit;
wherein the conversion factor and the generated defocus amount map are stored in the storage medium in association with the viewpoint images or an image obtained from the viewpoint images.

14. The image pickup apparatus according to claim 1, wherein the subpixels receive respective rays of a pencil having passed through different pupil subregions in an optical system.

* * * * *